United States Patent [19]

Nakao

[11] Patent Number: 4,806,829

[45] Date of Patent: Feb. 21, 1989

[54] APPARATUS UTILIZING CHARGED PARTICLES

[75] Inventor: Shuji Nakao, Itami, Japan

[73] Assignee: Mitsubishi Denki Kabushiki Kaisha, Japan

[21] Appl. No.: 78,086

[22] Filed: Jul. 27, 1987

[30] Foreign Application Priority Data

Jul. 28, 1986 [JP] Japan ................................ 61-178435

[51] Int. Cl.[4] ..................... H01J 37/256; H01J 37/317
[52] U.S. Cl. ................................. 315/111.81; 250/251;
250/423 R; 250/492.3; 313/230; 313/231.31;
315/111.41
[58] Field of Search ................... 250/251, 423 R, 427,
250/492.21, 492.3; 204/192.31, 192.34;
156/643; 315/111.81, 111.41, 111.21; 313/230,
231.31, 231.41

[56] References Cited

U.S. PATENT DOCUMENTS

| | | | |
|---|---|---|---|
| 3,523,210 | 8/1970 | Ernstene et al. | 315/111.21 |
| 3,790,411 | 2/1974 | Simms et al. | 250/251 X |
| 4,361,762 | 11/1982 | Douglas | 250/251 |
| 4,419,203 | 12/1983 | Harper et al. | 250/251 |
| 4,438,368 | 3/1984 | Abe et al. | 315/111.41 X |
| 4,463,255 | 7/1984 | Robertson et al. | 250/251 |
| 4,585,945 | 4/1986 | Bruel et al. | 250/492.2 |
| 4,639,301 | 1/1987 | Doherty et al. | 204/192.31 |
| 4,645,929 | 2/1987 | Crigern et al. | 250/306 |
| 4,652,795 | 3/1987 | Lee et al. | 315/111.41 |

FOREIGN PATENT DOCUMENTS

| | | | |
|---|---|---|---|
| 1284561 | 8/1969 | United Kingdom | 250/251 |
| 1284454 | 8/1969 | United Kingdom | 250/251 |

*Primary Examiner*—David K. Moore
*Assistant Examiner*—Mark R. Powell
*Attorney, Agent, or Firm*—Leydig, Voit & Mayer

[57] ABSTRACT

An apparatus utilizing charged particles comprises a means for generating charged particles which are irradiated on the surface of a material and a means for generating plasma in the neighborhood of the surface of the material. The plasma generated by the plasma generating means can neutralize incident charge, to prevent an accumulation of the charge on the surface of the material.

35 Claims, 2 Drawing Sheets

APPARATUS UTILIZING CHARGED PARTICLES

BACKGROUND OF THE INVENTION

This invention relates to an apparatus utilizing charged particles and more particularly, to an ion implantation apparatus used for producing semiconductor electronic circuits.

FIG. 1 is a partially sectioned schematic view showing an area around a semiconductor substrate in a conventional ion implantation apparatus. In this figure, a substrate 1 such as a semiconductor substrate which is to be ion-implantated is disposed on the wall of a vacuum chamber 2. Gas in the vacuum chamber 2 is exhausted to the extent that the scattering of an ion beam 3 is negligible by using a vacuum pump 4 provided on one side of the vacuum chamber 2. The ion beam 3 is generated by an ion beam generator (not shown), and then irradiated into the vacuum chamber 2 through an opening 2a thereof to implant ions into the substrate 1.

With the conventional apparatus utilizing charged particles constructed in the above manner, when an insulating material such as a photo-resist is formed on the surface of the substrate 1, the charge caused by the incidence of the ion beam 3 accumulates to generate a high electrical field around the insulating material. Therefore, there arises the problem that the high electrical field generated will destroy an electrical circuit formed on the semiconductor substrate 1.

SUMMARY OF THE INVENTION

Accordingly, an object of the present inventon is to provide an apparatus utilizing charged particles in which the charge produced by irradiation of the ion beam on the surface of a material such as a semiconductor substrate is prevented from accumulating.

In the present invention, a plasma is generated in the neighborhood of a material such as a semiconductor substrate where a charged particle beam is irradiated thereon, and then the plasma generated neutralizes the charge caused by the charged particle beam, whereby the accumulation of a charge at the surface of the substrate is prevented. Therefore, an apparatus utilizing charged particles can be obtained without an accompanying problem such as breakdown of an electric circuit in the semiconductor substrate due to charge accumulation.

In order to achieve the above object, according to one aspect of the present invention, there is provided an apparatus utilizing charged particles comprising: a charged particle generating means for generating charged particles which are irradiated on the surface of a material and a plasma generating means for generating a plasma in the neighborhood of the surface of the material.

According to another aspect of the present invention, there is provided a ion implantation apparatus comprising: a vacuum chamber maintained at a predetermined degree of vacuum therein; an ion beam generating means for generating an ion beam which is irradiated on a material disposed in the vacuum chamber; and a plasma generating means for generating a plasma in the neighborhood of the material.

BRIEF DESCRIPTION OF THE DRAWINGS

The present invention will become more readily apparent from the following detailed description of the preferred embodiments of the present invention when taken in conjunction with the accompanying drawings, in which.

DESCRIPTION OF THE PREFERRED EMBODIMENTS

Figure 1:
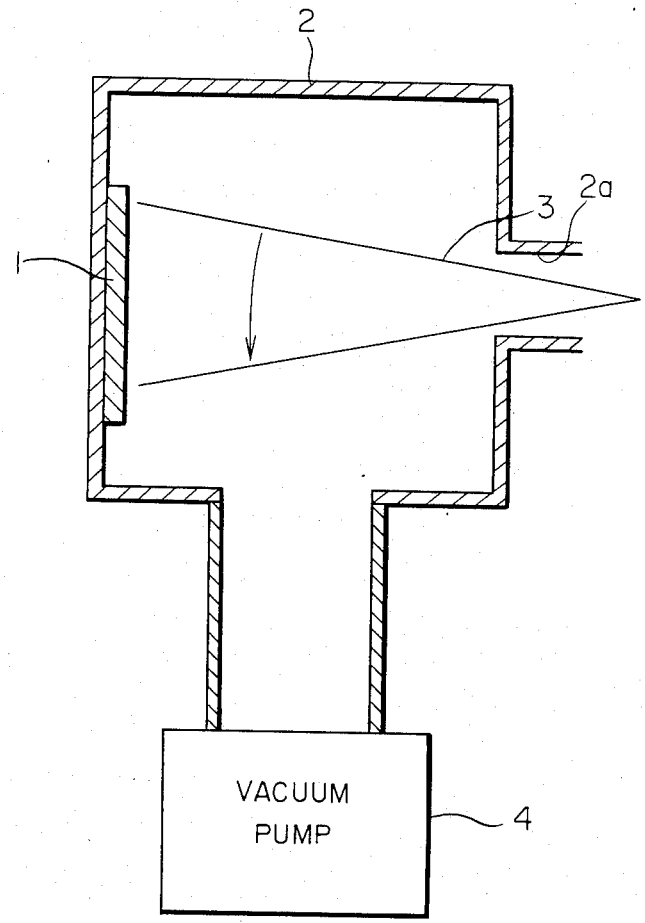
FIG. 1 is a partially sectioned schematic view showing ion implantation apparatus.
Figure 2:
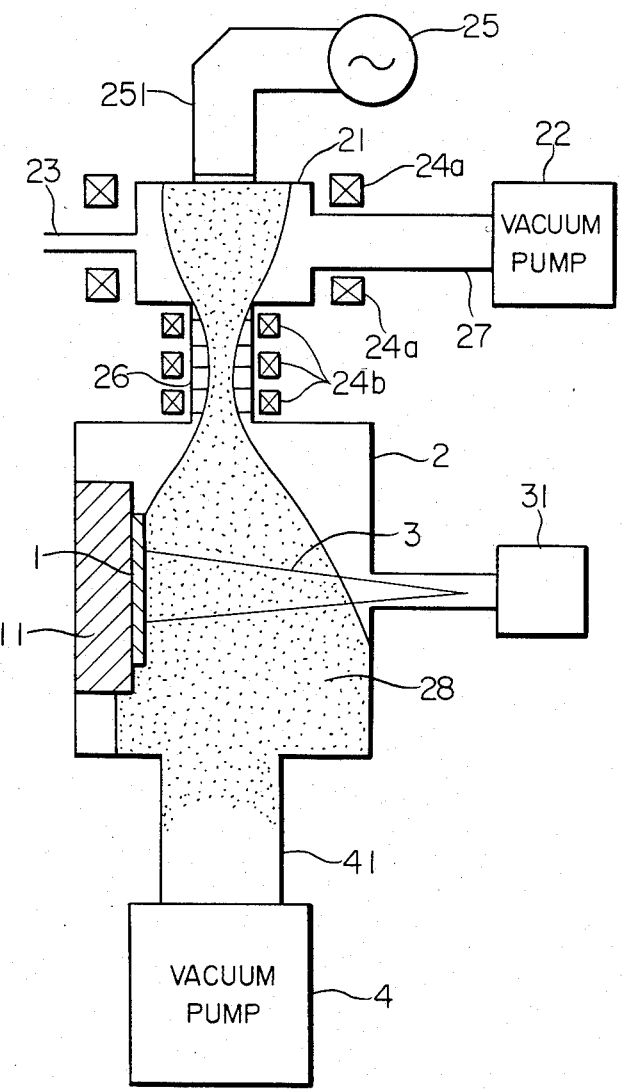
FIG. 2 is a partially sectioned schematic view showing an ion implantation apparatus according to one embodiment of the present invention.

FIG. 2 is a partially sectioned schematic view showing an ion implantation apparatus according to one embodiment of the present invention. In this figure, a substrate 1, such as a silicon wafer on the surface of which a silicon oxide layer is formed, is disposed on the wall of a vacuum chamber 2 using a support member 11. Plasma 28 generated in a vacuum vessel 21 is introduced into the vacuum chamber 2 through a throttle conduit 26. The vacuum chamber 2 is evacuated by a vacuum pump 4 which exhausts the gas in the chamber 2 through an exhaust line 41. The vacuum vessel 21 is connected with the vacuum chamber 2 through the throttle conduit 26 so that a pressure differential is maintained between the vacuum chamber 2 and the vacuum vessel 21 by the throttling action of the throttle cunduit 26. The vacuum vessel 21 is also evacuated by using a vacuum pump 22 to exhaust the gas in the vessel 21 through an exhaust line 27. Thus, a differential exhaust system is constituted by the vacuum pump 22, exhaust line 27, vacuum vessel 21, and throttle conduit 26. A plasma generating gas is introduced via a gas supply line 23 into the vacuum vessel 21 at a pressure required to generate a plasma. A first magnetic coil 24a is disposed to surround the vacuum vessel 21 so that, when energized, it generates a static magnetic field required for electronic cyclotron resonance at a plasma generating region in the vacuum vessel 21. Here, it is desirable that the intensity of the magnetic field produced by the first magnetic coil 24a is a value which does not influence the path of the ion beam 3. Microwave energy is then generated by a microwave generator 25 at frequencies in the 13.56 MHz band or 2.45 GHz band, and introduced through a waveguide 251 into the vacuum vessel 21 so that the plasma generating gas therein is excited by the electric field of this microwave to generate a plasma 28 through the electronic cyclotron resonance between the radio frequency power and the magnetic field. The plasma 28 thus generated is introduced from the vacuum vessel 21 to the vacuum chamber 2 under the action of the pressure differential therebetween. To control the supply of plasma a second magnetic coil 24b surrounds the throttle conduit 26 for controlling the flow rate and the direction of plasma flow from the vacuum vessel 21 to the vacuum chamber 2 via the throttle conduit 26. Materials contained in the generated plasma 28 may be the same as the ions in the ion beam 3. The generated plasma 28 diffuses in the throttle conduit 26 along the magnetic field, is introduced into the vacuum chamber 2 which is an end station, and then covers the surface of the silicon wafer substrate 1. Namely, the plasma 28 is introduced through the throttle conduit 26 into the region in the vacuum chamber 2 where the ion beam 3 is irradiated on the substrate 1. In this connection, it is to be noted that the flow rate of gas supplied from the vacuum vessel 21 to the vacuum chamber 2 is properly controlled or throttled by the throttle conduit 26 so as to maintain an appropriate pressure differential between the vacuum vessel 21 and the vacuum chamber 2. The pressure in the vacuum vessel 21, which is a plasma generating region, is maintained higher than that in the vacuum chamber 2, which is a charged particle incident region. Then, in the same manner as in the conventional ion implantation apparatus, the ion beam 3 is generated by an ion beam generating apparatus 31, introduced into the vacuum chamber 2, and then irradiated onto the surface of the substrate 1 in the form of a silicon wafer or the like, on the surface of which electric or electronic circuit patterns of a silicon oxide film is formed.

At this time, since the silicon oxide film is made of an insulating material, the incident charge, namely the charge generated by the irradiation of the ion beam 3, accumulates on the surface of the silicon wafer 1. If there is no plasma in the neighborhood of the surface of the substrate 1, an electrical field generated by the incident charge will concentrate around the substrate 1. In this case, if the intensity of the generated electrical field becomes too high, the insulating film will often break down electrically. In contrast to this, however, when plasma exists in the neighborhood of the surface of the substrate 1 as in the embodiment of the present invention, the number of electrons or anions or cations required for neutralizing the opposite charge on the substrate 1 are electrically attracted onto the surface of the substrate 1. At the same time, the same number of electrons or cations or anions of the opposite charge as those attracted onto the surface of the substrate 1 are attracted to the wall surfaces of the vacuum chamber 2, except for the place in which the substrate 1 is disposed, electrically connected with the ion beam generating means 31 so that the electrical neutrality of the substrate 1 and at the same time the neutrality of the plasma are both maintained. Accordingly, it is possible to avoid the problem that the insulating film on the surface of the substrate will be destroyed by the accumulation of the charge.

In the above-described embodiment, ions of the ion beam 3, which are irradiated on the silicon oxide surface of the silicon wafer substrate 1 used for producing a silicon semiconductor circuit, include ions of the third or the fifth group of elements in the periodic table, and ions of compounds containing the above elements such as $BF_2^+$. Ions of the ion beam 3 may be oxygen ions for forming an oxide film on the surface or in the inside of the substrate 1, nitrogen ions for forming a nitride film, or compounds containing these ions. Silicon ions which are for roughening the surface of the crystal silicon may also be used. Further, ions of the ion beam can also include rare gas ions such as of argon, xenon, helium, krypton, and neon, the first or the fourth group of elements in the periodic table, and ions of compounds containing those elements.

In the above-described embodiment, a silicon oxide film was used as the surface insulating material, however, commonly used silicon nitride film, siliconoxynitride film, metal oxide film having a high melting point, or a photoresist such as a photosensitive organic high polymer can also be used and can achieve the same effects as in the above embodiment.

In the above-described embodiment, as the plasma source a plasma generating source, which is provided with a differential exhaust system and has a pressure comparatively higher than that of the ion implantation region is employed. However, if the pressure of the plasma source is in a range where the incident ions are not scattered, the differential exhaust system is not always necessary and also, it is not necessary to provide a vacuum vessel for generating the plasma separately from the vacuum chamber into which the ion beam is irradiated. In this case, the plasma can be generated in the vacuum chamber.

In the above-mentioned embodiment, the plasma was generated by the electronic cyclotron resonance method using a static magnetic field, however, it is not limited to this method. Another method can also be used for generating the plasma such as an RF (radio frequency) discharge method, a direct current discharge method, and a laser ionization discharge method using a laser beam.

In the above-mentioned embodiment, an ion implantation apparatus was described, however, the present invention can also be applied to other apparatus for analyzing the surface of materials using charged particles such as electrons. Examples of such apparatus are scanning type electron microscopes, Auger electron spectroscopic apparatus, and secondary ion mass spectrometers. The present invention can also be applied to still other fine-processing apparatus for using charged particles such as those for patterning electronic circuits on a semiconductor substrate, focused ion beam display apparatus, or electron beam display apparatus. Further, the present invention is also effective when applied to any apparatus which is operated by irradiating charged particles to an insulating material, in which disadvantages would accrue from the accumulation of the charge on the surface of the insulating material.

While examples of the present invention have been described herein, it will be apparent to those skilled in the art that various modifications thereof can be made without departing from the scope of the invention as defined in the appended claims.

What is claimed is:

1. An apparatus utilizing charged particles comprising:
    charged particle generating means for generating electrically charged particles for irradiating the surface of a material whereby an electrical charge accumulates on the material; and
    plasma generating means for generating a plasma containing electrically charged particles in the neighborhood of the surface of the material wherein the electrically charged particles in the plasma are attracted by and neutralize the accumulated electrical charge at the surface of the material.

2. An apparatus utilizing charged particles as claimed in claim 1 wherein said charged particles are ions of an arbitrary material.

3. An apparatus utilizing charged particles as claimed in claim 2 wherein said ions are selected from the group consisting of argon, xenon, helium, krypton and neon.

4. An apparatus utilizing charged particles as claimed in claim 2 wherein said ions are selected from the group consisting of ions of the third group of elements of the periodic table, and ions of arbitrary compounds containing those elements.

5. An apparatus utilizing charged particles as claimed in claim 2 wherein said ions are selected from the group consisting of ions of the fourth group of elements of the periodic table, and ions of arbitrary compounds containing those elements.

6. An apparatus utilizing charged particles as claimed in claim 2 wherein said ions are selected from the group consisting of ions of the fifth group of elements of the periodic table, and ions of arbitrary compounds containing those elements.

7. An apparatus utilizing charged particles as claimed in claim 2 wherein said ions are selected from the group consisting of oxygen ions, nitrogen ions, ions of arbitrary compounds containing one of those ions, and ions of arbitrary compounds containing both of those ions.

8. An apparatus utilizing charged particles as claimed in claim 2 wherein said ions are selected from the group consisting of ions of the first group of elements of the periodic table, and ions of arbitrary compounds containing those elements.

9. An apparatus utilizing charged particles as claimed in claim 1 wherein said charged particles are electrons.

10. An apparatus utilizing charged particles as claimed in claim 1 wherein said material is an insulating material.

11. An apparatus utilizing charged particles as claimed in claim 1 wherein said material is a semiconductor circuit substrate used for forming an electronic circuit.

12. An apparatus utilizing charged particles as claimed in claim 11 wherein said semiconductor circuit substrate is a silicon substrate.

13. An apparatus utilizing charges particles as claimed in claim 11 wherein at least a part of the top surface of said semiconductor circuit substrate is an insulating material.

14. An apparatus utilizing charged particles as claimed in claim 13 wherein said insulating material is selected from the group consisting of silicon oxide film, silicon nitride film, siliconoxynitride film, and metal oxide film having a high melting point.

15. An apparatus utilizing charged particles as claimed in claim 13 wherein said insulating material is a photosensitive organic high polymer.

16. An apparatus utilizing charged particles as claimed in claim 1 wherein said plasma generating means utilizes one method selected from radio frequency discharge method, direct current discharge method, and laser ionization discharge method using a laser beam.

17. An apparatus utilizing charged particles as claimed in claim 16 wherein the frequency of said radio frequency discharge method is in a 13.56 MHz band.

18. An apparatus utilizing charged particles as claimed in claim 16 wherein the frequency of said radio frequency discharge method is in a 2.45 GHz band.

19. An apparatus utilizing charged particles as claimed in claim 1 wherein said plasma generating means is an electronic cyclotron resonance means which utilizes electronic cyclotron resonance between a radio frequency power and a magnetic field.

20. An apparatus utilizing charged particles as claimed in claim 19 wherein said magnetic field does not influence the path of the charged particles produced by said charged particle generating means.

21. An apparatus utilizing charged particles as claimed in claim 1 wherein said plasma generating means is spatially separated from said material.

22. An apparatus utilizing charged particles as claimed in claim 21 including means for maintaining a higher pressure at said plasma generating means than at said material.

23. An apparatus utilizing charged particles as claimed in claim 22 wherein said means for maintaining a higher pressure comprises a differential exhaust system.

24. An apparatus utilizing charged particles as claimed in claim 1 wherein a component of said plasma is identical to said charged particles.

25. An apparatus utilizing charged particles as claimed in claim 22 wherein the pressure in the vicinity of said material does not influence the path of the charged particles produced by said charged particle generating means.

26. An apparatus utilizing charged particles as claimed in claim 1 further comprising a vacuum chamber for housing the material to be irradiate and wherein the plasma contacts the material and a portion of said vacuum chamber which is electrical connected to a portion of said charged particle generating means.

27. An ion implantation apparatus comprising:
a vacuum chamber;
ion beam generating means for generating an ion beam for irradiating a material disposed in said vacuum chamber whereby an electrical charge accumulates on the material; and
plasma generating means for generating a plasma containing electrically charged particles in the neighborhood of the material wherein the electrically charged particles in the plasma are attracted by and neutralize the accumulated electrical charge at the surface of the material.

28. An ion implantation apparatus as claimed in claim 27 wherein said plasma generating means comprises:
a vacuum vessel for containing a plasma generating gas;
means for generating a magnetic field in said vacuum vessel;
microwave generating means for generating microwave energy to generate a plasma in the gas in said vacuum vessel; and
a throttle conduit connecting said vacuum chamber and said vacuum vessel and for creating a pressure difference therebetween so that the plasma flows from said vacuum vessel to said vacuum chamber.

29. An ion implantation apparatus as claimed in claim 28 wherein said means for generating a magnetic field comprises a first magnetic coil surrounding said vacuum vessel.

30. An ion implantation apparatus as claimed in claim 28 further comprising means for controlling the flow rate and the direction of flow of the plasma which flows from said vacuum vessel to said vacuum chamber through said throttle conduit.

31. An ion implantation apparatus as claimed in claim 30 wherein said means for controlling the flow rate and the direction of flow of said plasma comprises a second magnetic coil surrounding said throttle conduit.

32. An apparatus utilizing charged particles as claimed in claim 1 further comprising means for independently controlling the generation and supply of charged particles by said charged particle generating means and the generation and supply of the plasma by said plasma generating means.

33. An apparatus utilizing charged particles as claimed in claim 32 further comprising a vacuum vessel and a vacuum chamber for housing the material, said charged particle generating means introducing the charged particles into said vacuum chamber and said plasma generating means generating the plasma in said vacuum vessel, and wherein said independent control means comprises a differential exhaust system for creating a pressure differential between said vacuum chamber and said vacuum vessel for controlling the flow of the plasma from said vacuum vessel to said vacuum chamber.

34. An apparatus utilizing charged particles as claimed in claim 33 wherein said differential exhaust system comprises a first vacuum pump for exhausting said vacuum vessel, a second vacuum pump for exhausting said vacuum chamber, and a throttle conduit connecting said vacuum vessel and said vacuum chamber.

35. An apparatus utilizing charged particles as claimed in claim 34 wherein said independent control means further comprises a magnetic coil disposed around said throttle conduit.

* * * * *